United States Patent [19]

Nagai

[11] Patent Number: 5,716,868
[45] Date of Patent: Feb. 10, 1998

[54] FABRICATION METHOD OF SEMICONDUCTOR DEVICE WITH TRENCH ISOLATION STRUCTURE

[75] Inventor: Nobutaka Nagai, Tokyo, Japan

[73] Assignee: NEC Corporation, Tokyo, Japan

[21] Appl. No.: 361,665

[22] Filed: Dec. 22, 1994

[30] Foreign Application Priority Data

Dec. 24, 1993 [JP] Japan .................. 5-347357

[51] Int. Cl.⁶ .................................. H01L 21/76
[52] U.S. Cl. ........................... 437/67; 437/90
[58] Field of Search ................. 437/67, 89, 90, 437/228 SD; 148/DIG. 50, DIG. 85, DIG. 86

[56] References Cited

U.S. PATENT DOCUMENTS

| | | |
|---|---|---|
| 4,847,214 | 7/1989 | Robb et al. . |
| 4,870,029 | 9/1989 | Easter et al. . |
| 5,008,208 | 4/1991 | Liu et al. . |
| 5,130,268 | 7/1992 | Liou et al. . |
| 5,212,110 | 5/1993 | Pfiester et al. . |
| 5,387,538 | 2/1995 | Moslehi . |

FOREIGN PATENT DOCUMENTS

| | | |
|---|---|---|
| 3-21040 | 1/1991 | Japan . |
| 321040 | 1/1991 | Japan . |

*Primary Examiner*—George R. Fourson
*Attorney, Agent, or Firm*—Foley, Hoag & Eliot LLP

[57] ABSTRACT

A method for forming a semiconductor device that can reduces the in size or height of a step generated near the mouth of a trench as compared with steps formed according to conventional methods. A semiconductor substrate is selectively removed to produce a trench therein. Next, the trench is filled with polysilicon. A top end of the polysilicon is lower than a surface of the substrate and a hollow space is produced at the top end of the trench. Then, a silicon filler is selectively formed on the top end of the polysilicon in the trench by crystal growth. A top end of the filler is substantially on the same level with the surface of the substrate. The top end of the filler is preferably higher than the surface of the substrate by −0.1 μm to +0.2 μm.

6 Claims, 4 Drawing Sheets

FABRICATION METHOD OF SEMICONDUCTOR DEVICE WITH TRENCH ISOLATION STRUCTURE

BACKGROUND OF THE INVENTION

1. Field of the Invention

The present invention relates to a fabrication method of a semiconductor device and more particularly, to a fabrication method of a semiconductor device with a trench isolation structure, which is applicable to fabrication of bipolar transistors and/or metal-oxide-semiconductor field-effect transistors (MOSETs) on a semiconductor integrated circuit device.

2. Description of the Prior Art

In recent years, a trench isolation structure has been employed in bipolar semiconductor integrated circuit devices. In this structure, adjacent electronic elements such as bipolar transistors are laterally isolated by a narrow and deep groove that is termed a "trench". To isolate an element from other devices, the trench is generally formed so as to penetrate a semiconductor epitaxial layer formed on a semiconductor substrate and so as to surround the element concerned.

A first conventional fabrication method of the semiconductor device with a trench isolation structure is shown in FIGS. 1A to 1D.

In this method, first, an $n^+$-type diffusion region 22 acting as a buried layer of an npn bipolar transistor is selectively formed on a p-type silicon substrate 21. This process is carried out by a combination of lithography and ion-implantation or diffusion of an n-type dopant.

Next, silicon doped with an n-type impurity such as phosphorus (P) is epitaxially grown on the substrate 21 to cover the diffusion region 22, producing an n-type epitaxial layer 23 with a thickness of 2 µm, as shown in FIG. 1A.

After a silicon dioxide ($SiO_2$) film 24 is formed on the entire epitaxial layer 23, an $SiO_2$ film 24 is selectively formed in the epitaxial layer 22 by the local-oxidation of silicon (LOCOS) method, producing an isolation oxide film 25 with a thickness of 0.5 to 1.0 µm, as shown in FIG. 1A. This film 25 is formed for the purpose of lateral isolation and wiring capacitance reduction. The isolation oxide film 25 defines an active region on the epitaxial layer 23.

Then, the $SiO_2$ film 24 in the active region is selectively removed by photolithography and dry or wet etching to have a window 26, as shown in FIG. 1A. The window 26 surrounds the active region.

The epitaxial layer 23 is selectively removed by anisotropically etching through the window 26 to produce a trench 29. The trench 29 penetrates the layer 23 to reach the substrate 21, in other words, the trench 29 has a depth larger than the thickness of the epitaxial layer 23. The depth of the trench 29 is, for example, 5 µm. Also, in a plan view, the trench 29 extends along the isolation oxide film 25 in the active region. The etch residue generated in this process is then removed.

Subsequently, the exposed surfaces of the epitaxial layer 23 and the substrate 21 within the trench 29 are oxidized by several tens nanometers in thickness, so that an $SiO_2$ film 27 is produced on the surfaces. As shown in FIG. 1B, the film 27 covers both the sidewall and the bottom of the trench 29.

Silicon is then deposited on the $SiO_2$ film 24 by chemical vapor deposition (CVD) to produce a polysilicon film 28. During this process, polysilicon is deposited on the $SiO_2$ film 27 also in the trench 29 to fill the trench 29 entirely and the surface of the polysilicon film 28 becomes almost flat, as shown in FIG. 1C.

Further, the polysilicon film 28 is etched back by dry etching such as reactive ion etching (RIE) so that the surface of the $SiO_2$ film 24 is exposed, as shown in FIG. 1D. Thus, the isolation structure for the active region is made by the trench 29 refilled with polysilicon and $SiO_2$.

With the first conventional method, during the etching back process of the polysilicon film 28, the polysilicon film 28 in the trench 29 is etched deeper than the outside of the trench 29 by 0.3 to 0.5 µm due to overetching. For this reason, there arises a problem that large steps are produced between the remaining polysilicon film 28 and the $SiO_2$ film 24 at the mouth of the trench 29.

Such steps are caused by an excessive etching period of time for the polysilicon film 28. The excessive period is necessary for preventing etch residue on the $SiO_2$ film 24. In this case, after almost all the polysilicon film 28 is etched on the film 24, the remaining film 28 in the trench 29 is subjected to almost all the etching action. Therefore, the etch rate increases abruptly after almost all the polysilicon film 28 on the film 24 is etched, resulting in large steps.

To solve this problem, a second conventional fabrication method of this sort was developed, which is shown in FIGS. 2A to 2D.

In this method, first, in the same way as the first conventional method, an $n^+$-type diffusion region 32 acting as a buried layer of an npn bipolar transistor is selectively formed on a p-type silicon substrate 31. Next, n-type silicon is epitaxially grown on the substrate 31 to cover the diffusion region 32, producing an n-type epitaxial layer 33 with a thickness of 2 µm. After an $SiO_2$ film 34 is formed on the entire epitaxial layer 33, an isolation oxide film 35 of $SiO_2$ is selectively formed in the epitaxial layer 33 to define an active region on the layer 33. The state at this time is shown in FIG. 2A.

Subsequently, silicon nitride ($Si_3N_4$) is grown by CVD to form an $Si_3N_4$ film 40 with a thickness of 0.1 µm on the $SiO_2$ film 34. The film 40 acts as an etching stop in the following etching process. An $SiO_2$ film 41 with a thickness of 0.5 µm is then formed by CVD on the $Si_3N_4$ film 40. The film 41 acts as a mask for the following etching process and as a stop for preventing a depression or hollow of polysilicon causing the large steps described previously.

The $SiO_2$ film 41, the $Si_3N_4$ film 40 and the $SiO_2$ film 34 are selectively removed by photolithography and dry etching to form a window 36 penetrating these films 41, 40 and 34, as shown in FIG. 2A. The window 36 surrounds the active region.

Then, the epitaxial layer 33 is selectively removed by anisotropically etching through the window 36 to produce a trench 39. The trench 39 penetrates the layer 33 to reach the substrate 31, in other words, the trench 39 has a depth larger than the thickness of the epitaxial layer 33. The depth of the trench 39 is, for example, 5 µm. Also, in a plan view, the trench 39 extends along the isolation oxide film 35 in the active region. The etch residue generated in this process is then removed.

Subsequently, the exposed surfaces of the epitaxial layer 33 and the substrate 31 within the trench 39 are oxidized by several tens nanometers in thickness, so that an $SiO_2$ film 37 is produced on the surfaces. As shown in FIG. 2B, the film 37 covers both the sidewall and the bottom of the trench 39.

Polysilicon is then deposited by CVD to produce a polysilicon film 38 on the $SiO_2$ film 41. During this process, polysilicon is deposited on the SiO₂ film 37 so that the deposited polysilicon fills the trench 39 entirely and the surface of the polysilicon film 38 becomes almost flat, as shown in FIG. 2B.

Further, the polysilicon film 38 is etched back by dry etching so that the surface of the SiO₂ film 41 is exposed, as shown in FIG. 2C. At this time, the top end of the polysilicon film 38 remaining in the trench 39 is slightly lower than the surface of the film 41 due to overetching.

Following this, the SiO₂ film 41 and the Si₃N₄ film 40 are entirely removed by wet etching. Thus, such an isolation structure as shown in FIG. 2D is obtained using the refilled trench 39 with polysilicon and SiO₂.

It is seen from FIG. 2D that the top end of the remaining polysilicon film 38 is slightly higher than the surface of SiO₂ film 34.

With the second conventional method, the polysilicon film 38 is etched deeper (for example, by about 300 nm) in the trench 39 than the outside of the trench 39 due to the etch rate difference during the etching back process. However, since the SiO₂ film 41, and the Si₃N₄ film 40 are provided on the SiO₂ film 34, the top end of the remaining polysilicon film 38 in the trench 39 becomes higher than the surface of the film 34.

As a result, such a depression or hollow as shown in FIG. 1D is not generated in the trench 39. This means that the large steps described previously can be prevented by controlling the total thickness of the films 40 and 41.

Additionally, to solve the problem relating to the large steps, a third conventional fabrication method of this sort was also developed, which is disclosed in the Japanese Non-Examined Patent Publication No. 3-21040 (January, 1991).

In this method, through the same process sequence as that of the first conventional method, the polysilicon film 28 is formed on the SiO₂ film 24 so as to fill the trench 29, as shown in FIG. 1C. Then, instead of the etching back process, the polysilicon film 28 is abraded using an abrasive material or powder such as colloidal silica so that the polysilicon film 28 on the SiO₂ film 24 is removed and the film 28 in the trench 29 is left.

With the first conventional method, to remove the unwanted polysilicon film 28 on the SiO₂ film 24, an excessive etching period of time is adopted compared with the thickness of the deposited film 28. This period is determined considering (a) dispersion in total thickness of the polysilicon film 28 and underlying materials, i.e., the substrate 21, the epitaxial layer 23 and SiO₂ film 24, (b) irregularity or unevenness of the surface through the prior processes such as an oxidation process in the LOCOS method, and (c) the in-plane ununiformity of the etching rate of polysilicon, or the like.

As described previously, due to the excessive etching period, the polysilicon film 28 is overecthed in the trench 29, resulting in large steps at the mouth of the trench 29. The large steps cause the following problem.

In a subsequent process to the etching process of the polysilicon film 28, a wiring or interconnection film is formed on or over the SiO₂ film 24 using a metal such as aluminum. In this process, cut or breakdown of the metal wiring film tends to occur, and the metal film is not etched out completely so that it remains in the vicinity of the mouth of the trench 29.

With the second conventional method, the additional processes of forming the Si₃N₄ film 41 and the SiO₂ film 40 and that of etching the films 41 and 40 are required. Therefore, this method presents the problems of an increased number of required processes and complexity in fabrication.

Further, with the third conventional method, the endpoint of the abrasion process is difficult to be detected. As a result, due to the surface irregularity of the SiO₂ film 24, there is a problem in that the polysilicon film 28 also tends to be partially abraded in order to remove the polysilicon film 28 on the SiO₂ film 24 completely, resulting in formation of large steps, as in the first conventional method, at the mouth of the trench 29.

SUMMARY OF THE INVENTION

Accordingly, an object of the present invention is to provide a fabrication method of a semiconductor device that reduces steps in size or height as compared with steps formed according to conventional methods.

Another object of the present invention is to provide a fabrication method of a semiconductor device in which the number of necessary processes is less than that in the second conventional method.

Still another object of the present invention is to provide a fabrication method of a semiconductor device that prevents defects and failure such as cut and short of a wiring or interconnection film due to steps produced at the mouth of the trench.

A fabrication method of a semiconductor device according to the invention contains the following steps:

selectively removing a semiconductor substrate to produce a trench in the substrate;

filling the trench with polysilicon, so that a top end of the polysilicon is lower than a surface of the substrate and a hollow space is produced on the top end; and selectively forming a silicon filler on the top end of the polysilicon in the trench to fill the space by crystal growth. A top end of the filler is substantially on the same level with the surface of the substrate.

According to the method of the present invention, the trench is filled with the polysilicon so that the top end of the polysilicon is lower than the surface of the substrate and a hollow space is produced at the top of the trench. Then, the silicon filler is selectively formed by crystal growth on the top end of the protrusion to fill the space.

Therefore, by controlling crystal growth of the silicon filler, the top end of the filler can be substantially on the same level with the surface of the insulator film. This means that no step arises near the top end of the filler, or that even if a step arises near the tope end, the size or height of the step decreases drastically from that formed according to prior art methods.

Also, since only one step of crystal growth of the silicon filler is added compared with the first conventional method discussed above, the number of necessary processes is less than that in the second conventional method discussed above.

Further, as there is no step or only a small step at the top end of the filler, defects and failure such as cut and short of a wiring or interconnection film can be avoided.

It is not necessary for the top end of the filler to be exactly or perfectly on the same level with the surface of the insulator film. The top end of the filler may be lower or higher than the surface of the insulator film. Preferably, the top end of the filler is higher than the surface of the insulator film by −0.1 pm to +0.2 pm.

The substrate may have an epitaxial layer thereon. In this case, the insulator film is formed on the epitaxial layer, and the trench is typically formed to penetrate the epitaxial layer to reach the underlying substrate.

The silicon filler may be made of single-crystal silicon or polysilicon.

DETAILED DESCRIPTION OF THE PREFERRED EMBODIMENTS

A preferred embodiment of the present invention will be described below, with reference to the attached drawings.

FIGS. 3A to 3D show a fabrication method of a semiconductor device according to an embodiment of the present invention.

Figure 1A:
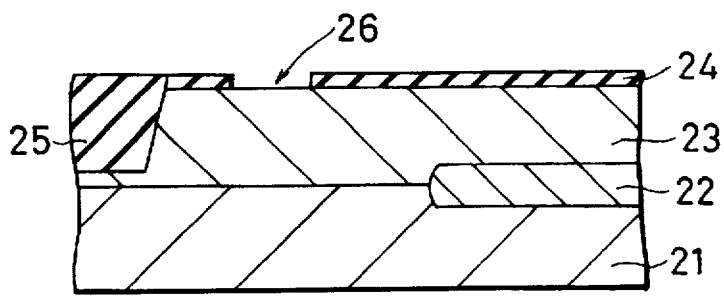
FIGS. 1A to 1D are partial cross-sectional views showing a first conventional fabrication method of a semiconductor device.
Figure 1B:
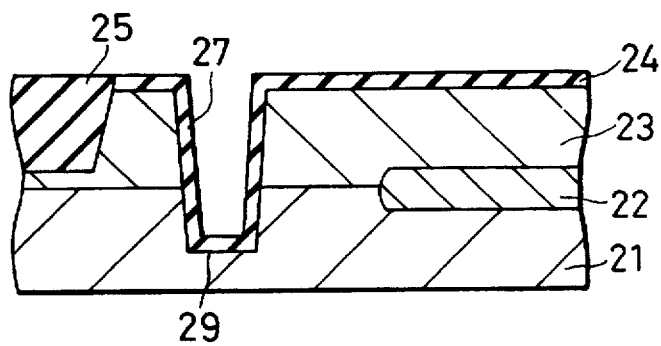
Figure 1C:
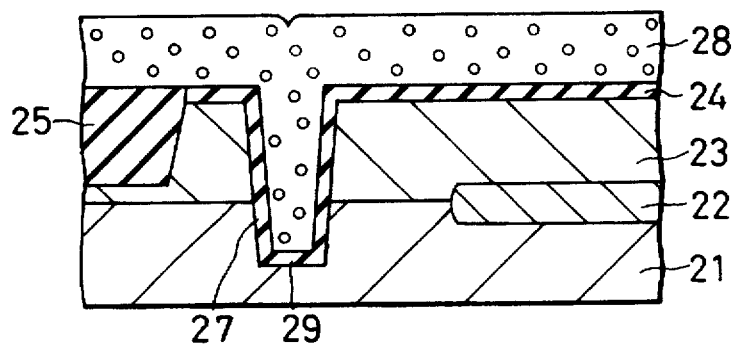
Figure 1D:
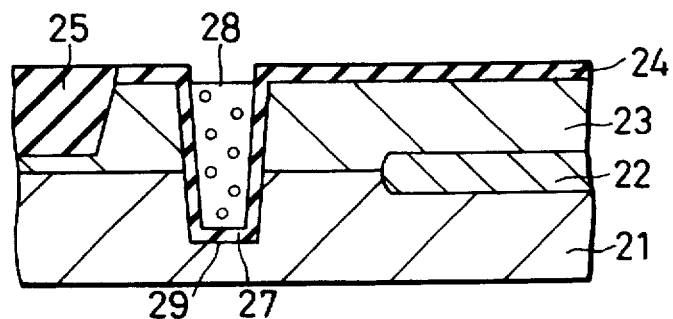
Figure 2A:
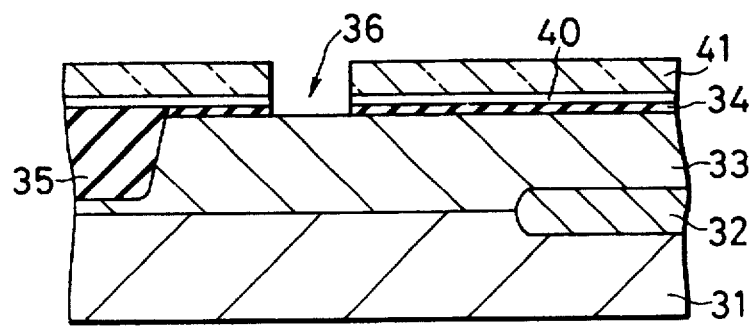
FIGS. 2A to 2D are partial cross-sectional views showing a second conventional fabrication method of a semiconductor device.
Figure 2B:
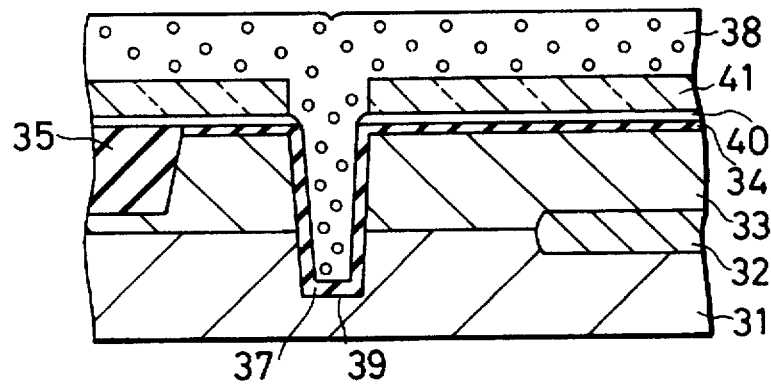
Figure 2C:
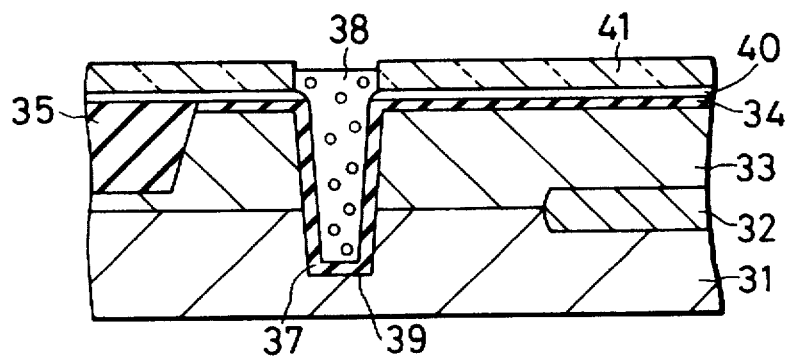
Figure 2D:
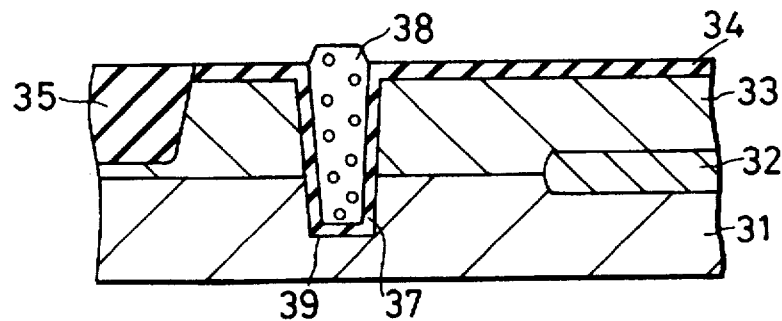
Figure 3A:
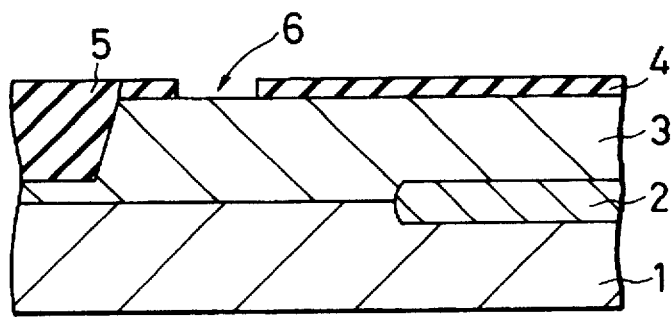
FIGS. 3A to 3D are partial cross-sectional views showing a fabrication method of a semiconductor device according to an embodiment of the present invention.

In this method, first, as shown in FIG. 3A, an $n^+$-type diffusion region 2 acting as a buried layer of an npn bipolar transistor is selectively formed on a p-type silicon substrate 1. This process is carried out by a combination of lithography and ion-implantation or diffusion of an n-type dopant.

Next, silicon doped with an n-type impurity such as phosphorus (P) is epitaxially grown on the substrate 1 to cover the diffusion region 2, producing an n-type epitaxial layer 3 with a thickness of about 2 µm, as shown in FIG. 3A.

After an $SiO_2$ film 4 is formed on the entire epitaxial layer 3 by thermal oxidation, an $Si_3O_4$ film (not shown) is formed on the entire film 4 by CVD.

Then, the $SiO_2$ film 4 and the $Si_3O_4$ film thus stacked are selectively removed by photolithography and etching to have a window (now shown). Using the stacked $SiO_2$ film 4 and the $Si_3O_4$ film as a mask, the epitaxial layer 3 is selectively etched to produce a groove with a given depth in the layer 3 through the window. The $Si_3O_4$ film is then removed.

Using the $Si_3O_4$ film on the $SiO_2$ film 4 as a mask, the epitaxial layer 3 is thermally oxidized to produce selectively an isolation oxide film 5 in the groove (LOGOS method).

The isolation oxide film 5 is formed for the purpose of lateral isolation and wiring capacitance reduction. The film 5 defines an active region with a rectangular plan shape on the epitaxial layer 3.

The isolation oxide film 5 may be canceled because a trench for the isolation purpose is formed in the subsequent process.

Next, the $SiO_2$ film 4 in the active region is selectively removed by photolithography and etching to produce another window 6 in the film 4 for trench formation, as shown in FIG. 3A. In a plan view, the window 6 runs along the isolation oxide film 5 to surround the bipolar transistor in the active region.

Figure 3B:
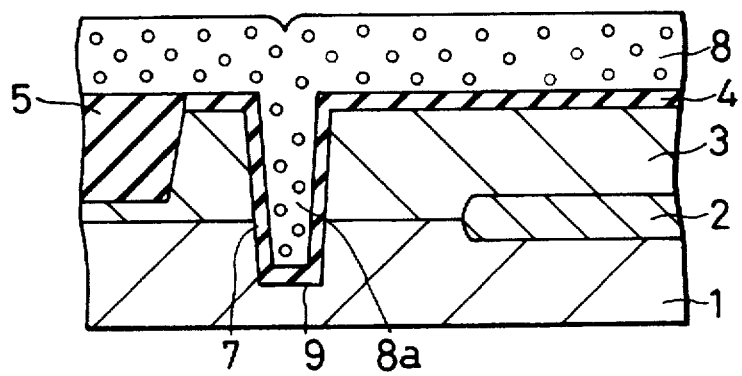

Using the $SiO_2$ film 4 with the window 6 as a mask, the epitaxial layer 3 is selectively removed by anisotropically etching to produce a trench 9 with a depth of about 5 µm therein, as shown in FIG. 3B. The trench 9 runs along the same rectangular plan shape as that of the window 6. The trench 9 penetrates the layer 3 to reach the substrate 1, in other words, the trench 9 has a depth larger than the thickness of the epitaxial layer 3.

After removing the etch residue generated in this process, the exposed surfaces of the epitaxial layer 3 and the substrate 1 within the trench 9 are thermally oxidized, so that an $SiO_2$ film 7 with a thickness of several tens nanometers is produced on the surfaces. As shown in FIG. 3B, the sidewall oxide film 7 covers both the sidewall and the bottom end of the trench 9.

Silicon is then deposited on the $SiO_2$ film 4 to cover the trench 9 by low-pressure CVD (LPCVD) to produce a polysilicon film 8. During this process, the thickness of the polysilicon film 8 is controlled so that the trench 9 is entirely filled with this deposited polysilicon and the surface of the polysilicon film 8 becomes almost flat. The film 8 has a protrusion 8a protruding into the trench 9, as shown in FIG. 3B.

Figure 3C:
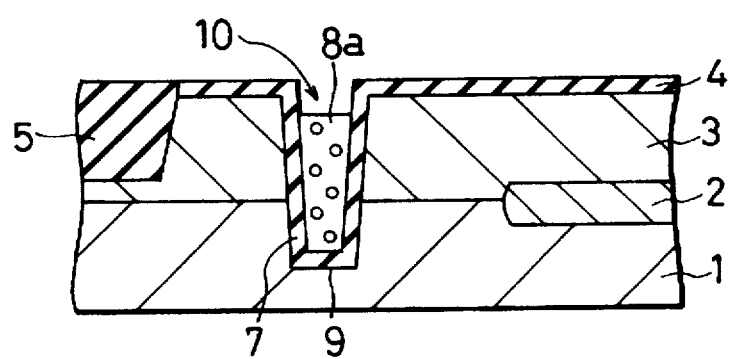

Further, the polysilicon film 8 is etched back by dry etching such as RIE so that the surface of the $SiO_2$ film 4 is exposed and only the polysilicon protrusion 8a is left in the trench 9. Thus, the isolation structure for the active region is made by the trench 9 refilled with polysilicon and $SiO_2$, as shown in FIG. 3C.

During this etching back process, the polysilicon film 8 in the trench 9 is etched deeper than the outside of the trench 9 due to overetching. As a result, steps are produced near the mouth of the trench 9, in other words, a small, hollow space 10 is generated on the top end of the polysilicon protrusion 8a in the trench 9. The difference in height between the top end of the remaining polysilicon film protrusion or plug 8a and the surface of the $SiO_2$ film 4 is about 0.3 to 0.5 µm.

Subsequently, to reduce the step in height or size, after cleaning, single-crystal silicon is selectively grown on the exposed top end of the polysilicon protrusion or plug 8a so that a silicon filler 11 is produced thereon to fill the hollow space 10. Thus, polysilicon protrusion or plug 8a is used as a seed for crystal growth of silicon filler 4. This crystal growth process is carded out in a crystal growth furnace at 1100° C. using the mixture of $SiH_2Cl$, $H_2$, and HCl gasses as a reaction gas.

The crystal growth condition is not limited to that of this embodiment. Any other condition suitable for growing filler 11 may be employed.

The resultant thickness of the filler 11 is determined by controlling its growth time and growth rate, or the like. Therefore, the top end of the filler 11 can be easily set on the same level as the surface of the $SiO_2$ film 4.

Figure 4:
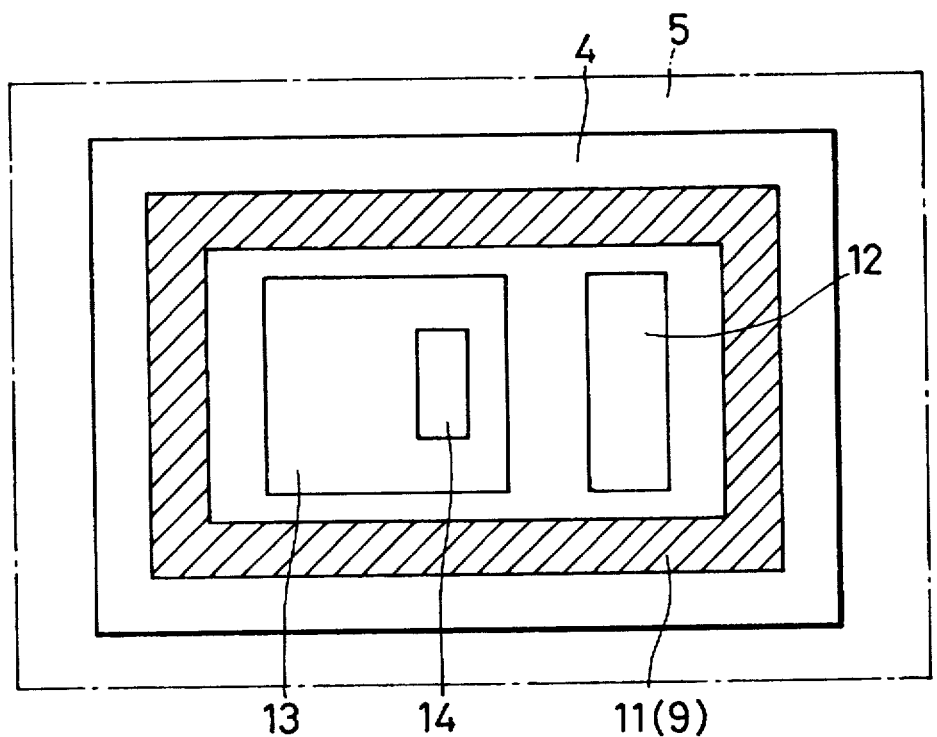
FIG. 4 is a partial plan view of the semiconductor device fabricated by an embodiment of the method of the present invention.

Thereafter, an $n^+$-type collector contact 12 contacted with the $n^+$-type buried region 2, a p-type base region 13 and an n-type emitter region 14 are formed in the epitaxial layer 3 sequentially by a conventional method, resulting in the npn-type bipolar transistor within the trench 9, as shown in FIG. 4.

According to the inventive method, the silicon filler 11 is selectively formed by crystal growth on the top end of the protrusion 8a (the seed for crystal growth of silicon filler 11) to fill the hollow space 10. Therefore, by controlling the crystal growth of the filler 11, the top end of the filler 11 can be substantially on the same level with the surface of the $SiO_2$ film 4. Thus, almost no step arises near the top end of the filler 11.

As a result, defects and failure such as cut and short of a wiring or interconnection film are avoided.

Also, since only one step of crystal growth of the silicon filler 11 is added as compared with the first conventional method discussed above, the number of necessary processes is less than that of the second conventional method discussed above.

I have found that, in general, the top end of the filler 11 is higher than the surface of the $SiO_2$ film 4 by 0.2 μm or less, or the top end of the filler 11 is lower than the surface of the $SiO_2$ film 4 by 0.1 μm or less.

According to the present invention, although the substrate 1 includes epitaxial layer 3, with trench 9 formed to penetrate the layer 3 to reach the substrate 1, a semiconductor substrate without an epitaxial layer may be used.

As described above, the trench 9 can be used for isolating the npn bipolar transistor from other elements. Trench 9 may also be used for any other element, for example, a pnp bipolar transistor, an MOSFET or the like.

Further, filler 11 can be made of single-crystal silicon, or, as discussed above, it can be made of selectively grown polysilicon.

Figure 3D:
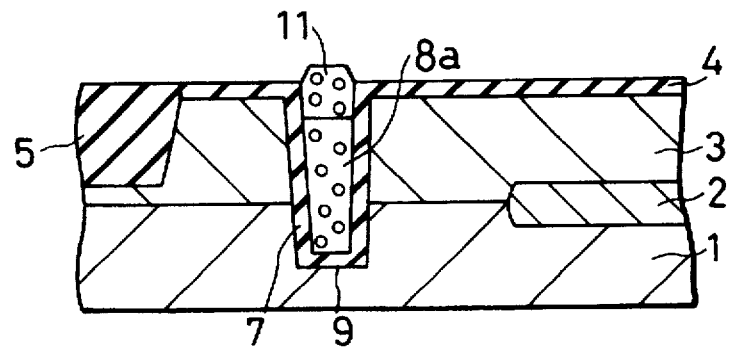

The buried layer 2 can be spaced apart from the trench 9 as shown in FIGS. 3B-3D it can be expanded to cross the trench 9.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A method of fabricating a semiconductor device, comprising:

providing a semiconductor substrate having a surface;

selectively removing the semiconductor substrate to form a trench having sidewall and bottom surfaces in the substrate;

forming an insulator film on the surface of the substrate so that the insulator film covers the surface of the substrate and the sidewall and bottom surfaces of the trench;

forming a polysilicon plug to partially fill the trench by first overfilling the trench with polysilicon and then etching the polysilicon back so that the top end of the polysilicon plug is lower than the surface of the insulator film to form a space between the top end of the polysilicon plug and the surface of the insulator film; and selectively forming a polysilicon filler on the top end of the polysilicon plug in the trench to fill the space by crystal growth so that the top end of the silicon filler is substantially level with the surface of the insulator film.

2. The method as claimed in claim 1, wherein the top end of the silicon filler is higher than the surface of the insulator film by about −0.1 μm to +0.2 μm.

3. A method of fabricating a semiconductor device, comprising the steps of:

forming a buried layer of a first conductivity type on a semiconductor substrate of a second conductivity type opposite in polarity to the first conductivity type;

forming an epitaxial layer of the first conductivity type on the substrate to cover the buried layer;

forming an insulator film with a window on the semiconductor substrate;

selectively removing the substrate using the insulator film as a mask so that a trench is formed at a position corresponding to the window in the substrate;

forming a polysilicon film on the insulator film to cover the trench so that the polysilicon film has a protrusion that protrudes into the trench and fills the trench;

selectively removing the polysilicon film so that only the protrusion is left in the trench and the top end of the protrusion is lower than the surface of the insulator film to form a space between the top end of the protrusion and the surface of the insulator film; and selectively forming a polysilicon filler on the top end of the protrusion to fill the space by crystal growth so that the top end of the filler is substantially level with the surface of the insulator film.

4. The method as claimed in claim 3, wherein the top end of the silicon filler is higher than the surface of the insulator film by about −0.1 μm to +0.2 μm.

5. The method as claimed in claim 1, wherein the silicon filler is made of selectively grown polysilicon.

6. The method as claimed in claim 3, wherein the silicon filler is made of selectively grown polysilicon.

* * * * *